(12) United States Patent
Stegner et al.

(10) Patent No.: US 10,943,979 B2
(45) Date of Patent: Mar. 9, 2021

(54) SEMICONDUCTOR DEVICE HAVING A SEMICONDUCTOR BODY COMPOSED OF SILICON CARBIDE

(71) Applicant: Infineon Technologies AG, Neubiberg (DE)

(72) Inventors: Andre Rainer Stegner, Unterhaching (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/277,227

(22) Filed: Feb. 15, 2019

(65) Prior Publication Data
US 2019/0259841 A1    Aug. 22, 2019

(30) Foreign Application Priority Data
Feb. 16, 2018   (DE) .......................... 102018103550.0

(51) Int. Cl.
| | | |
|---|---|---|
| *H01L 29/16* | (2006.01) | |
| *H01L 29/10* | (2006.01) | |
| *H01L 29/423* | (2006.01) | |
| *H01L 29/861* | (2006.01) | |
| *H01L 29/417* | (2006.01) | |

(Continued)

(52) U.S. Cl.
CPC ...... *H01L 29/1608* (2013.01); *H01L 29/1095* (2013.01); *H01L 29/167* (2013.01); *H01L 29/36* (2013.01); *H01L 29/41741* (2013.01); *H01L 29/4236* (2013.01); *H01L 29/7813* (2013.01); *H01L 29/8611* (2013.01); *H01L 29/861* (2013.01)

(58) Field of Classification Search
CPC ............. H01L 29/1608; H01L 29/1095; H01L 29/167; H01L 29/36; H01L 29/41741; H01L 29/4236; H01L 29/7813; H01L 29/8611; H01L 29/861
See application file for complete search history.

(56) References Cited

U.S. PATENT DOCUMENTS

| | | | | |
|---|---|---|---|---|
| 2009/0114969 A1* | 5/2009 | Suzuki | ............... | H01L 29/0619 257/301 |
| 2015/0008446 A1* | 1/2015 | Losee | ................. | H01L 29/7811 257/77 |
| 2015/0155355 A1 | 6/2015 | Losee et al. | | |

FOREIGN PATENT DOCUMENTS

DE        102016104256 B3     7/2017

OTHER PUBLICATIONS

Smith, S.R., et al., "Shallow Acceptor Levels in 4H- and 6H-Sic", Journal of Electronic Materials, vol. 28, No. 3, 1999, pp. 190-195.

* cited by examiner

*Primary Examiner* — Timor Karimy
(74) *Attorney, Agent, or Firm* — Murphy, Bilak & Homiller, PLLC

(57) ABSTRACT

The disclosure relates to a semiconductor device having a SiC semiconductor body. The SiC semiconductor body includes a first semiconductor region of a first conductivity type and a second semiconductor region of a second conductivity type. The first semiconductor region is electrically contacted at a first surface of the SiC semiconductor body and forms a pn junction with the second semiconductor region. The first semiconductor region and the second semiconductor region are arranged one above the other in a vertical direction perpendicular to the first surface. The first semiconductor region has a first dopant species and a second dopant species.

17 Claims, 8 Drawing Sheets

(51) Int. Cl.
*H01L 29/78* (2006.01)
*H01L 29/167* (2006.01)
*H01L 29/36* (2006.01)

FIG 9

SEMICONDUCTOR DEVICE HAVING A SEMICONDUCTOR BODY COMPOSED OF SILICON CARBIDE

TECHNICAL FIELD

The disclosure relates to semiconductor devices composed of silicon carbide, SiC.

BACKGROUND

In respect of SiC semiconductor devices such as, for example, SiC power semiconductor field effect transistors or SiC power semiconductor diodes, requirements are made with regard to the reliability during the specified operating lifetime. The reliability of the SiC semiconductor device can be adversely affected during operation by various degradation mechanisms.

This disclosure is devoted to improving the reliability of SiC semiconductor devices.

SUMMARY

This disclosure relates to a semiconductor device, comprising a SiC semiconductor body. The SiC semiconductor body comprises a first semiconductor region of a first conductivity type and a second semiconductor region of a second conductivity type. The first semiconductor region is electrically contacted at a first surface of the SiC semiconductor body and forms a pn junction with the second semiconductor region. The first semiconductor region and the second semiconductor region are arranged one above the other in a vertical direction perpendicular to the first surface. The first semiconductor region has a first dopant species and a second dopant species.

Those skilled in the art will recognize additional features and advantages upon reading the following detailed description, and upon viewing the accompanying drawings.

BRIEF DESCRIPTION OF THE DRAWINGS

The accompanying drawings serve to afford an understanding of exemplary embodiments, are included in the disclosure and form part thereof. The drawings merely illustrate exemplary embodiments and together with the description serve to elucidate same. Further exemplary embodiments and numerous advantages from among those intended will become apparent directly from the following detailed description. The elements and structures shown in the drawings are not necessarily illustrated in a manner true to scale with respect to one another. Identical reference signs refer to identical or mutually corresponding elements and structures.

DETAILED DESCRIPTION

In the following detailed description, reference is made to the accompanying drawings, which form part of the disclosure and show specific exemplary embodiments for illustration purposes. In this context, a direction terminology such as "top side", "bottom", "front side", "rear side", "at the front", "at the back", etc. is related to the orientation of the figures currently being described. Since the component parts of the exemplary embodiments can be positioned in different orientations, the direction technology serves only for explanation and should in no way be interpreted as limiting.

It goes without saying that further exemplary embodiments exist and structural or logical changes can be made to the exemplary embodiments, without departing from what is defined by the patent claims in the process. The description of the exemplary embodiments is non-limiting in this respect. In particular, elements of exemplary embodiments described below can be combined with elements of other exemplary embodiments from among those described, unless something different is evident from the context.

The terms "have", "contain", "encompass", "comprise" and the like hereinafter are open terms which on the one hand indicate the presence of said elements or features, and on the other hand do not exclude the presence of further elements or features. The indefinite articles and the definite articles encompass both the plural and the singular, unless something different is clearly evident from the context.

In accordance with one exemplary embodiment, a semiconductor device comprises a SiC semiconductor body. The SiC semiconductor body comprises a first semiconductor region of a first conductivity type and a second semiconductor region of a second conductivity type. The first semiconductor region is electrically contacted at a first surface of the SiC semiconductor body and forms a pn junction with the second semiconductor region. The first semiconductor region and the second semiconductor region are arranged one above the other in a vertical direction perpendicular to the first surface. The first semiconductor region has a first dopant species and a second dopant species.

In accordance with one exemplary embodiment, an energy gap between the first dopant species and the closest band edge is less than 250 meV and an energy gap between the second dopant species and the closest band edge is more than 250 meV. If a third dopant species is present in the first semiconductor region, then its energy gap with respect to the closest band edge can also be more than 250 meV. The closest band edge can be for example the valence band edge in the incorporated state of the dopant species into the crystal lattice of the SiC semiconductor body. Likewise, the closest band edge can be the conduction band edge in the incorporated state of the dopant species into the crystal lattice of the SiC semiconductor body, depending on which of the two band edges in the incorporated state of the dopant species is located energetically closer to the energy level of the dopant species in the band gap of SiC.

By way of example, the SiC semiconductor body can be constructed from monocrystalline silicon carbide (SiC), for example 2H—SiC (SiC of the 2H polytype), 6H—SiC or 15R—SiC. In accordance with one exemplary embodiment, the material of the SiC semiconductor body is 4H—SiC. Here and hereinafter the fact that a component "is composed of" a material or "is constructed from" a material can mean that said component consists of the material within the scope of the production tolerances and with the exception of dopings.

The first surface can form the front side of the SiC semiconductor body and be planar or ribbed. A ribbed first surface can be caused by a tilting of a principal lattice plane of the SiC semiconductor body with respect to a growth direction. A normal to a planar section of the first surface or to a central plane of a ribbed first surface defines the vertical direction. The vertical direction can extend along the growth direction. In the case of a ribbed first surface, the latter can comprise coplanar surface sections which each extend obliquely, i.e. at an inclination, with respect to the vertical direction. Directions perpendicular to the vertical direction or, to put it another way, parallel to a planar section of the first surface or parallel to the central plane of a ribbed first surface are lateral (horizontal) directions.

In accordance with one exemplary embodiment, the first conductivity type is a p-type and the second conductivity type is an n-type. In accordance with another exemplary embodiment, the first conductivity type is a p-type and the second conductivity type is an n-type.

The semiconductor device can be for example an IGFET (insulated gate field effect transistor), for example a MOSFET (metal oxide semiconductor FET) such as a power MOSFET, wherein the abbreviation MOSFET also encompasses FETs having gate electrodes composed of a semiconductor material besides FETs having a metallic gate electrode. The semiconductor device can also be an MCD (MOS controlled diode) or a pn diode such as a SiC power semiconductor diode. Likewise, the semiconductor device can be an IGBT (insulated gate bipolar transistor) or else a JFET (junction field effect transistor). Besides the exemplary component types mentioned, it is also possible, of course, to form other bipolar component types or else unipolar component types with an integrated pn freewheeling diode as a semiconductor device in accordance with the teaching described herein. The semiconductor device can be configured to conduct a load current of at least 1 A, e.g. by means of a corresponding dimensioning of the chip area carrying the load current.

The pn junction formed between the first semiconductor region and the second semiconductor region is for example a pn junction via which in specific operating modes of the semiconductor device, e.g. in forward operation of a diode or in forward operation of an inverse diode, e.g. of a body-drain diode of a FET, charge carriers are injected into the second semiconductor region, which charge carriers can then recombine in the second semiconductor region. Consequently, the first semiconductor region in a semiconductor device fashioned as a diode can be formed for example as an anode region (cathode region) at the first surface of the SiC semiconductor body. In this case, the second semiconductor region can be fashioned as a drift zone and a cathode region (anode region). Likewise, the first semiconductor region can be formed as a body region or else as a further semiconductor region—with injection capability—of the conductivity type of the body, e.g. as an electrical shielding region for a dielectric at a trench bottom of a FET or IGBT. In this case, the second semiconductor region can be fashioned as a drift zone or else a current distribution zone.

In accordance with one exemplary embodiment, the first dopant species corresponds to aluminium (Al). Alternatively or additionally, the second dopant species corresponds to boron (B) or gallium (Ga).

In one exemplary embodiment, the first semiconductor region has a third dopant species of the first conductivity type. The third dopant species differs from the second dopant species. By way of example, the second dopant species is B and the third dopant species is Ga, or vice versa. It is possible for the first dopant species to be aluminium, while it is possible to form boron as second dopant species and gallium as third dopant species in the first semiconductor region.

The combined doping with boron and gallium can be advantageous in particular to the effect that on the one hand both serve as dopants having deep energy levels, but on the other hand have a distinctly different diffusion behaviour, such that e.g. in particular the influence of a deep diffusion of boron can be chosen by means of a corresponding choice of the implanted dopant dose such that the boron doping that results in the final state in the drift zone lies significantly below the donor doping set, which is preferably effected by way of a nitrogen doping, and thus does not prevent the resulting n-type doping targeted. In addition, the combination of two dopants having energy levels with different depths enables a fine optimization of the recombination properties of the p-doped layer formed in such a way.

In accordance with one exemplary embodiment, an energy level of the second dopant species in the state incorporated into the SiC semiconductor body within the band gap of the SiC lies closer to a band gap centre than the energy level of the first dopant species by more than 50 meV, or by more than 100 meV or else by more than 200 meV. If a third dopant species is formed in the first semiconductor region, then the energy level of the third dopant species in the state incorporated into the SiC semiconductor body within the band gap of the SiC can also lie closer to a band gap centre than the energy level of the first dopant species by more than 50 meV, or by more than 100 meV, or else by more than 200 meV.

The examples described above enable for example a reduced injection of charge carriers from the first semiconductor region into the second semiconductor region. This is achieved by means of the recombination effect of the first and optionally third dopant species, which lie deeper in the band gap in comparison with the first dopant species and have a stronger recombination effect and also, in the non-depleted state, i.e. e.g. in forward operation, have a lower degree of doping activation than the first dopant species. In comparison with an alternative semiconductor device whose first semiconductor region has only a single dopant species or does not have the first and second dopant species, it is thereby possible for example to reduce a charge carrier injection into the second semiconductor region by virtue of a reduced injection and an increased recombination. The reduced charge carrier injection into the second semiconductor region enables for example the technical advantage of a lower degradation of the semiconductor device as a result of recombination-dictated growth of stacking faults in the basal plane, i.e. in planar layers extending parallel, which impede the charge transport and adversely affect the forward voltage and also the forward resistance of the respective semiconductor device. Stacking faults of this type can constitute for instance an inclusion—restricted to a lattice constant—of the thermodynamically stable 3C polytype in a 4H or 6H environment. The reliability of SiC semiconductor devices can thus be improved by the teaching described herein.

Figure 1:
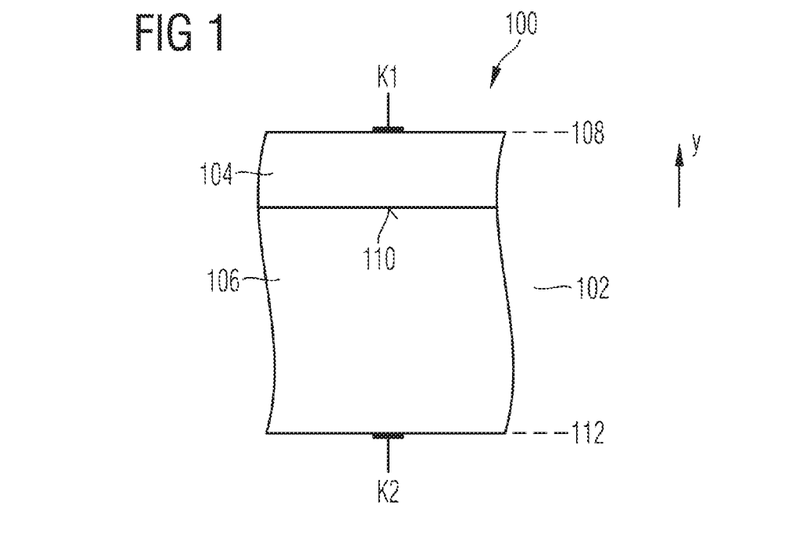
FIGS. 1 to 4 are schematic cross-section views of a SiC semiconductor body of a semiconductor device in accordance with exemplary embodiments.

The schematic cross-sectional view in FIG. 1 illustrates one exemplary embodiment of a semiconductor device 100. The semiconductor device 100 comprises a SiC semiconductor body 102. The SiC semiconductor body 102 comprises a first semiconductor region 104 of a first conductivity type and a second semiconductor region 106 of a second conductivity type. The first semiconductor region 104 can be a first semiconductor region as described above. Likewise, the second semiconductor region 106 can be a second semiconductor region as described above.

The first semiconductor region 104 is electrically contacted at a first surface 108 of the SiC semiconductor body 100. The electrical contact is illustrated in a simplified manner as first contact K1. The first contact K1 is for example a conductive structure that can comprise electrically interconnected conductive components such as, for instance, contact lugs, metallization tracks and terminal pads. The electrically conductive components, for their part, consist of conductive material such as, for instance, a metal, a metal silicide, a metal alloy, a highly doped semiconductor or a combination thereof. Said electrically conductive components are for example parts of a metallization and wiring region of the semiconductor device 100 that is formed above the first surface 108. In the case of a semiconductor device 100 configured as an IGBT, the first contact K1 can be an emitter contact. In the case of a semiconductor device 100 configured as a FET or a JFET, the first contact K1 can be a source contact. In the case of a semiconductor device 100 configured as a diode or a thyristor, the first contact K1 can be an anode contact (cathode contact).

The first semiconductor region 104 forms a pn junction 110 with the second semiconductor region 106. The first semiconductor region 104 and the second semiconductor region 106 are arranged one above the other in a vertical direction y perpendicular to the first surface 108.

The second semiconductor region 106 is electrically contacted at a second surface 112 of the SiC semiconductor body 100, said second surface being situated opposite the first surface 108. The electrical contact is illustrated in a simplified manner as second contact K2. The indications given above in association with the first contact K1 are analogously applicable to the second contact K2. In the case of a semiconductor device 100 configured as an IGBT, the second contact K2 can be a collector contact. In the case of a semiconductor device 100 configured as a FET or a JFET, the first contact K1 can be a drain contact. In the case of a semiconductor device 100 configured as a diode or a thyristor, the first contact K1 can be a cathode contact (anode contact).

Figure 2:
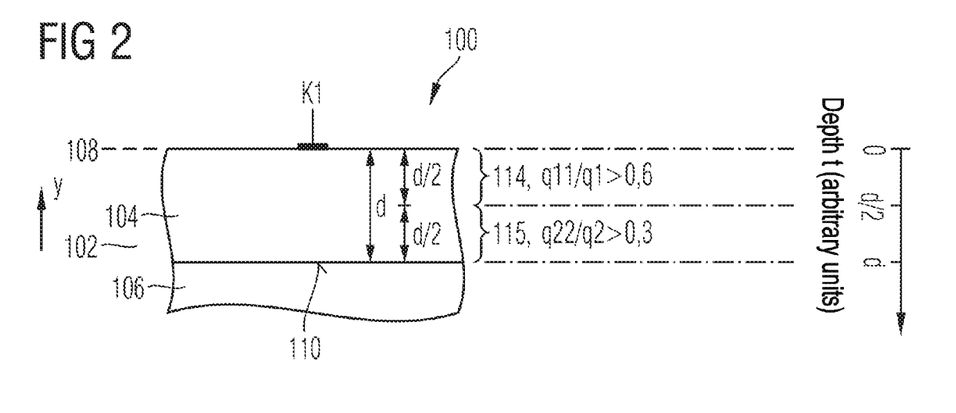

In accordance with the exemplary embodiment of the semiconductor device 100 as shown in the schematic cross-sectional view in FIG. 2, the first semiconductor region 104 has a vertical extension d along the vertical direction y of the SiC semiconductor body 102. In this exemplary embodiment, proceeding from the first surface 108, in a first depth range 114 of the SiC semiconductor body 102 from a depth $t=0$ to $t=d/2$, at least 60% or even at least 80% of the dopants of the first conductivity type correspond to the first dopant species. The dopants of the first conductivity type of the first dopant species can have a relatively shallow energy level. In a second depth range 115 of from $t=d/2$ to $t=d$, at least 30% or even at least 50% of the dopants of the first conductivity type correspond to the second dopant species. The second dopant species of the first conductivity type can contain one dopant or two dopants, which can each have deep energy levels. It is possible, in particular, for the dopants of the second dopant species to be formed with exclusively one or exclusively two dopants, with the exception of impurities. The first depth range 114 involves for example an upper part of the first semiconductor region 104, and the second depth range 115 involves for example a lower part of the first semiconductor region 104.

If the dopant dose of the first conductivity type, i.e. relative to all dopant species of the first conductivity type, in the first depth range 114 of the first semiconductor region 104 is designated by q1 and the doses of the first and second dopant species are designated by q11 and q12, then the following holds true in the first depth range 114:

$$q11/q1 > 0.6. \quad (1)$$

If the dopant dose of the first conductivity type, i.e. relative to all dopant species of the first conductivity type, of the first semiconductor region 104 in the second depth range 115 is designated by q2 and the doses of the first and second dopant species are designated by q21 and q22, then the following holds true in the second depth range 115:

$$q22/q2 > 0.3. \quad (2)$$

A dopant dose in the first depth range 114 indicates the dopant concentration integrated along the vertical direction in the first depth range 114 of from $t=0$ to $t=d/2$, i.e. a quantity of dopants relative to unit area, e.g. $cm^2$. A dopant dose in the second depth range 115 indicates the dopant concentration integrated along the vertical direction in the second depth range 115 of from $t=d/2$ to $t=d$, i.e. a quantity of dopants relative to unit area, e.g. $cm^2$. In accordance with this exemplary embodiment, the second dopant species serving for recombination is on average positioned closer to the pn junction 110 than the first dopant species. In other words, the predominant proportion of the second dopant species is positioned closer to the pn junction 110 than the predominant proportion of the first dopant species, wherein "predominant" can be taken to mean at least 50%, in particular at least 80%, of the quantity of the respective dopant species. Generally, the term "on average" in this application can relate to a predominant proportion of the respective dopant species. Consequently, a charge carrier injection attributable to the first dopant species, in view of the second dopant species positioned more deeply on average, can be reduced by the recombination effect of the second dopant species. This can have an advantageous effect on the reliability of the semiconductor device.

In accordance with one exemplary embodiment, a maximum dopant concentration of the first dopant species in the first depth range 114 is greater than a maximum dopant concentration of the second dopant species in the second depth range 115.

In accordance with a further exemplary embodiment, a maximum dopant concentration of the first dopant species in the first depth range 114 is less than a maximum dopant concentration of the second dopant species in the second depth range 115. It is possible that such a distribution of the dopant concentrations is not critical for the injection conditions since, in the case of deep energy levels in the neutral state, only a relatively small proportion of the dopants introduced is electrically active and therefore makes only relatively little contribution to the charge carrier injection.

Figure 3:
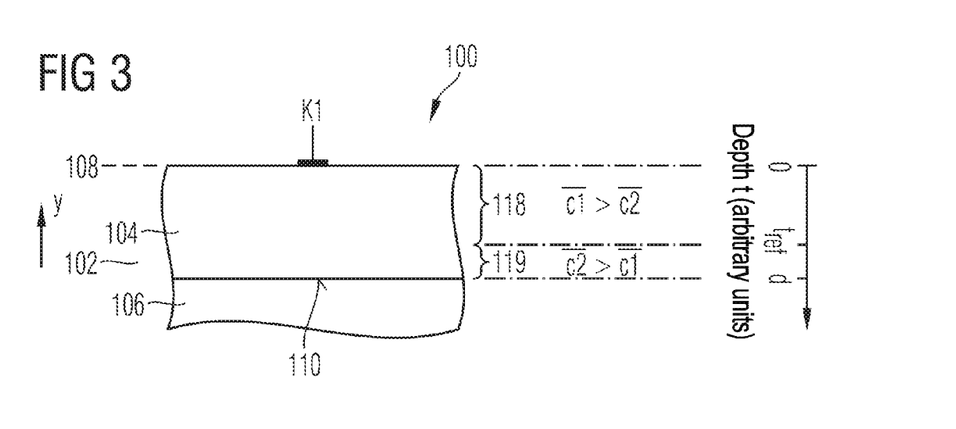

In accordance with the exemplary embodiment of the semiconductor device 100 as shown in the schematic cross-sectional view in FIG. 3, an average dopant concentration of the first dopant species $\overline{c1}$ in a first part 118 of the first semiconductor region 104 adjoining the first surface 108 of the SiC semiconductor body 102 is greater than an average dopant concentration of the second dopant species $\overline{c2}$. In a second part 119 of the first semiconductor region 104 adjoining the second semiconductor region 106, the average dopant concentration of the second dopant species $\overline{c2}$ is greater than the average dopant concentration $\overline{c1}$ of the first dopant species. The term average dopant concentration denotes an average value of the dopant concentration in the respective region.

Consequently, the following holds true in the first part 118, i.e. in the depth range of from t=0 to t=tref, wherein tref identifies a reference depth at which the first part 118 adjoins the second part 119 along the vertical direction y:

$$\overline{c1} > \overline{c2}. \quad (3)$$

Likewise, the following holds true in the second part 119, i.e. in the depth range of from t=tref to t=d:

$$\overline{c2} > \overline{c1}. \quad (4)$$

In this case, c1 denotes the dopants having the relatively shallow energy levels (for example nitrogen atoms) and c2 denotes one or more dopants having relatively deep energy levels (for example boron and/or gallium).

In a narrower depth range than that indicated above, depending on the implantation conditions, e.g. the implantation energies and annealing conditions used, respectively the opposite behaviour can also be present as long as equations (3) and (4) above are satisfied in this exemplary embodiment. Likewise, $c1(t) > c2(t)$ can be satisfied for each depth in the first part, while $c2(t) > c1(t)$ can be satisfied for each depth in the second part.

As described in association with the exemplary embodiment according to FIG. 2, in the exemplary embodiment according to FIG. 3 as well, the second dopant species serving for recombination is on average positioned closer to the pn junction 110 than the first dopant species. Therefore, the advantages explained in association with the exemplary embodiment in FIG. 2 can be achieved with this exemplary embodiment as well.

By way of example, the reference depth tref lies in a range of between 50% and 80% of the vertical extension d of the first semiconductor region 104 into the SiC semiconductor body 102, that is to say that the following holds true in accordance with this exemplary embodiment:

$$0.5d \leq tref \leq 0.8d. \quad (5)$$

In accordance with one exemplary embodiment, the first semiconductor region is p-doped and the second semiconductor region is n-doped. A partial compensation of the n-type doping with boron can be present in a part of the n-doped drift zone adjoining the p-doped first semiconductor region. This leads to a reduction of the charge carrier mobility on account of the additional scattering centres of the boron in the drift zone. The partial dopant compensation additionally reduces the net background charge. An increased breakdown strength can advantageously be achieved as a result. Moreover, the additional boron doping in the drift zone can advantageously influence the propagation of harmful crystal defects.

Figure 4:
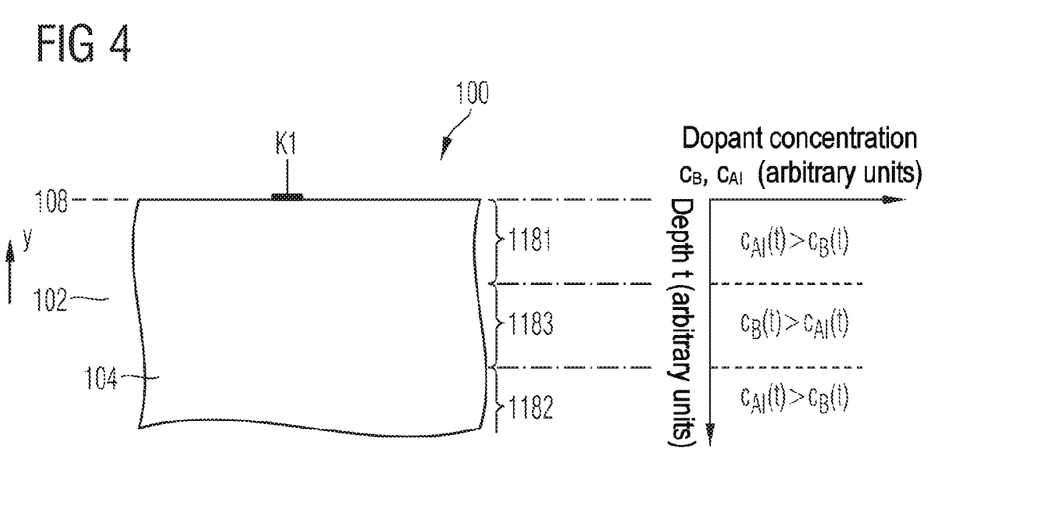

In accordance with one exemplary embodiment, illustrated by way of example in the schematic view in FIG. 4, the first dopant species is aluminium and the second dopant species is boron, and in a first partial region 1181 and a second partial region 1182 of the first semiconductor region 104, said second partial region being at a distance from the first partial region 1181 in the vertical direction y, a concentration of aluminium $c_{Al}$ is greater than a concentration of boron $c_B$. A third partial region 1183 lies between the first partial region 1181 and the second partial region 1182, in which third partial region a concentration of boron $c_B$ is greater than a concentration of aluminium $c_{Al}$. By this means, by way of example, it is possible to reduce a number of Al implantations during the formation of the first semiconductor region 104 by virtue of the fact that partial regions which are spaced apart vertically and in which the dopant species Al is predominant are electrically connected to one another by regions in which the dopant species B is predominant. In view of the greater diffusion of boron in SiC in comparison with Al, it is thus possible to reduce the total number of implantations during the formation of the first semiconductor region 104. By way of example, a maximum concentration of aluminium in the first partial region 1181 and the second region 1182 is greater than a maximum concentration of boron in the third partial region 1183. Beneath the second partial region 1182 there can follow one or more further partial regions of the first semiconductor region 104, e.g. the or a part of the second depth range 115 in accordance with FIG. 2. Optionally, one or else a plurality of these partial regions can additionally contain the dopant species gallium.

FIGS. 5A to 5D show profiles of dopant concentrations for forming the first semiconductor region 104. The profiles of the implantations forming the first semiconductor region 104 versus a vertical extension into the depth t are illustrated in this case.

In the diagram in 5A, the first semiconductor region 104 is formed by superposing a first profile of an Al concentration $c1_{Al}$ and a first profile of a B concentration $c1_B$, which is deeper in comparison with the first profile of an Al concentration $c1_{Al}$. The depth range in which the concentration $c1_{Al}$ is greater than the concentration $c1_B$ corresponds for example to the first part 118 in the exemplary embodiment in FIG. 3, and the depth range in which the concentration $c1_B$ is greater than the concentration $c1_{Al}$ corresponds for example to the second part 119 in the exemplary embodiment in FIG. 3. It goes without saying that the first semiconductor region 104 can also be constructed from a superposition of a plurality of Al implantation profiles whose maxima lie at different depths. Likewise, the first semiconductor region 104 can also be constructed from a superposition of a plurality of B implantation profiles whose maxima lie at different depths. This likewise holds true with regard to the further exemplary profiles illustrated in FIGS. 5B to 5D. A profile of a dopant concentration cc in the second semiconductor region 106 is illustrated for example as a constant profile in FIGS. 5A to 5D. Optionally, one or else both of these partial regions can additionally contain the dopant species gallium.

Figure 5A:
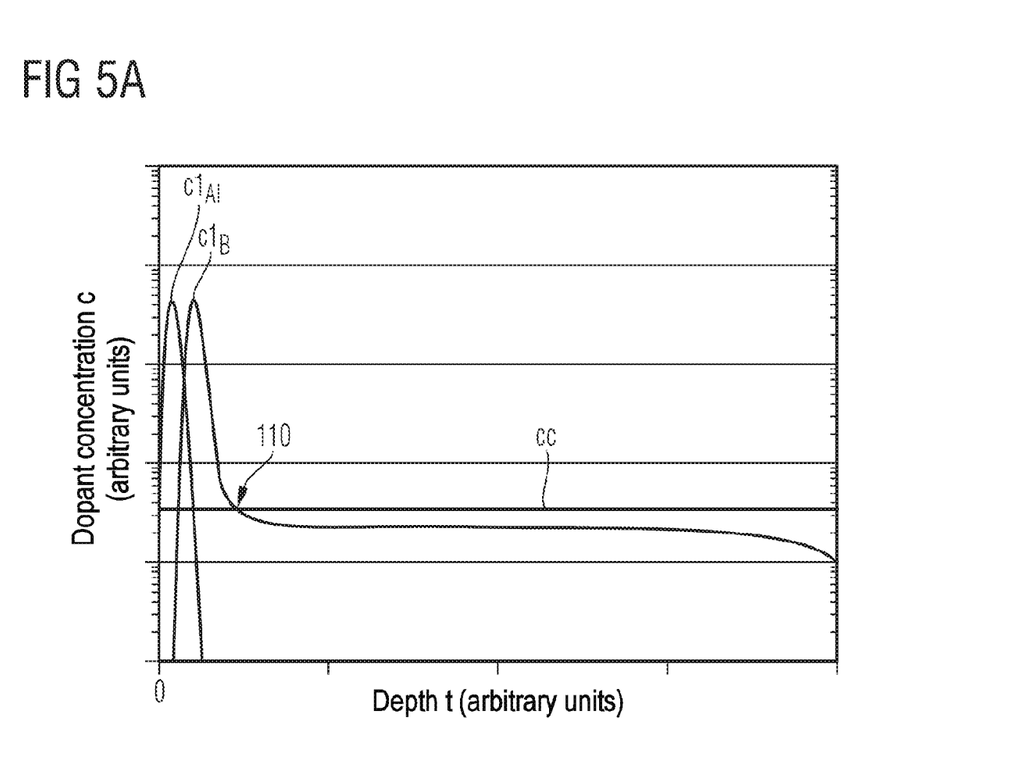
FIGS. 5A to 5D are schematic diagrams for illustrating superposed concentrating profiles in a first semiconductor region.
Figure 5B:
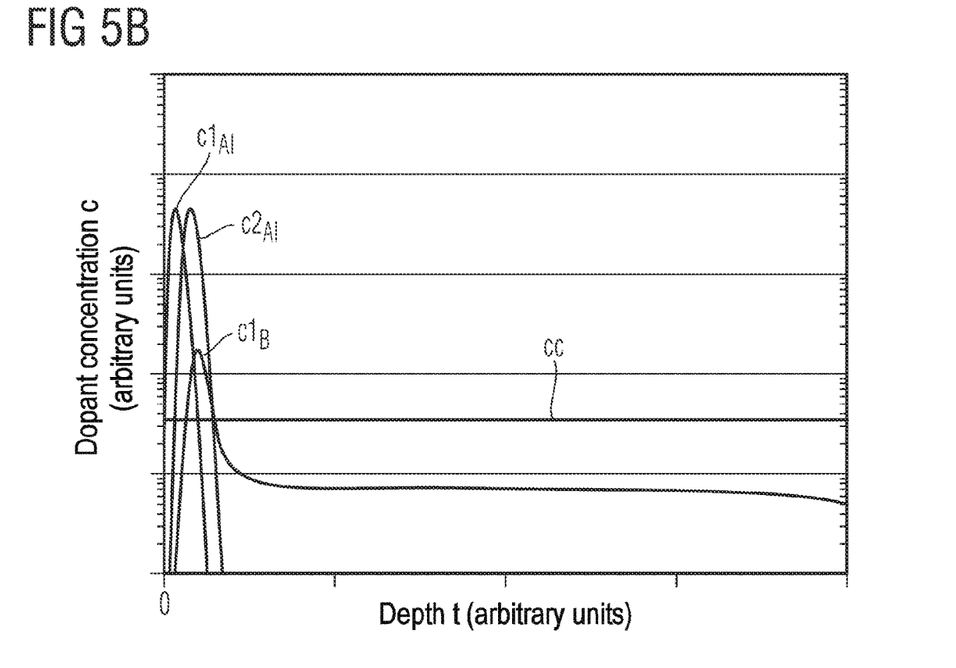

In the diagram in 5B, the first semiconductor region 104 is formed by superposing a first profile of an Al concentration $c1_{Al}$, a second profile of an Al concentration $c2_{Al}$, which is deeper in comparison with the first profile of an Al concentration $c1_{Al}$, and a first profile of a B concentration $c1_B$, whose maximum lies in the region of the depth of the maximum of the concentration $c2_{Al}$. The second profile of an Al concentration $c2_{Al}$ can also be replaced or supplemented by a gallium doping profile.

Figure 5C:
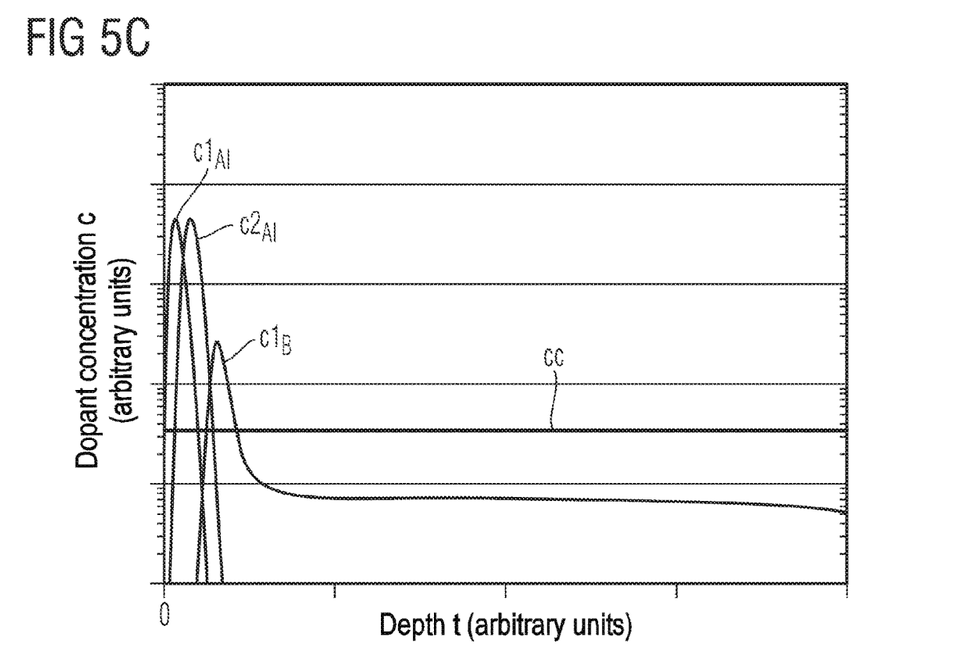
Figure 5D:
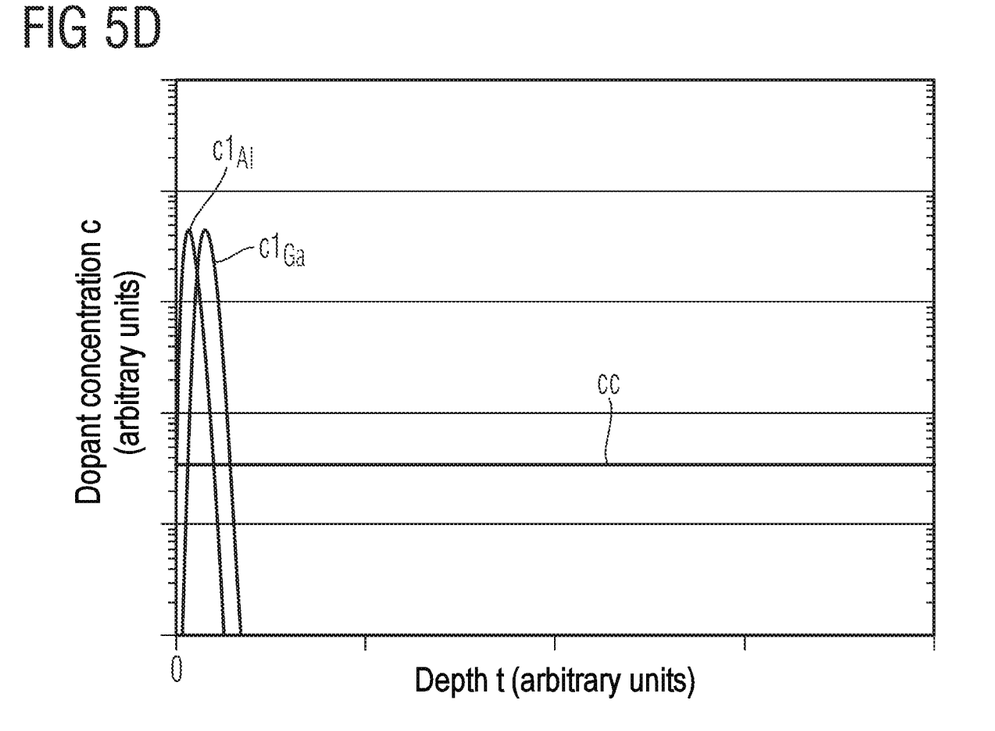

In the diagram in 5C, the first semiconductor region 104 is formed by superposing a first profile of an Al concentration $c1_{Al}$, a second profile of an Al concentration $c2_{Al}$, which is deeper in comparison with the first profile of an Al concentration $c1_{Al}$, and a first profile of a B concentration $c1_B$, whose maximum is deeper than the depth of the maximum of the concentration $c2_{Al}$. The second profile of an Al concentration $c2_{Al}$ can also be replaced or supplemented by a gallium doping profile.

In the diagram in 5D, the first semiconductor region 104 is formed by superposing a first profile of an Al concentration $c1_{Al}$ and a first profile of a Ga concentration $c1_{Ga}$, which is deeper in comparison with the first profile of an Al concentration $c1_{Al}$. The depth range in which the concentration $c1_{Al}$ is greater than the concentration $c1_{Ga}$ corresponds for example to the first part 118 in the exemplary embodiment in FIG. 3, and the depth range in which the concentration $c1_{Ga}$ is greater than the concentration $c1_{Al}$ corresponds for example to the second part 119 in the exemplary embodiment in FIG. 3. In comparison with boron, gallium does not exhibit a portion diffusing rapidly into the depth of the semiconductor body. This can be recognized from the outliers in the profile $c1_B$ in FIGS. 5A to 5C, which are absent in the profile $c1_{Ga}$ in FIG. 5D. Said outliers in the profile $c1_B$ lead to a partial dopant compensation of n-type dopants with boron. This leads to a reduction of the charge carrier mobility on account of the additional scattering centres of boron. The partial dopant compensation additionally reduces the net background charge. An increased breakdown strength and a reduced propagation of defects can advantageously be achieved as a result, although this effect can slightly increase the on resistance of a MOSFET, for which reason a possibility for optimization of the electrical properties of the semiconductor chips can also be made possible by a combination of all three dopants, i.e. Al, Ga and B.

Figure 6A:
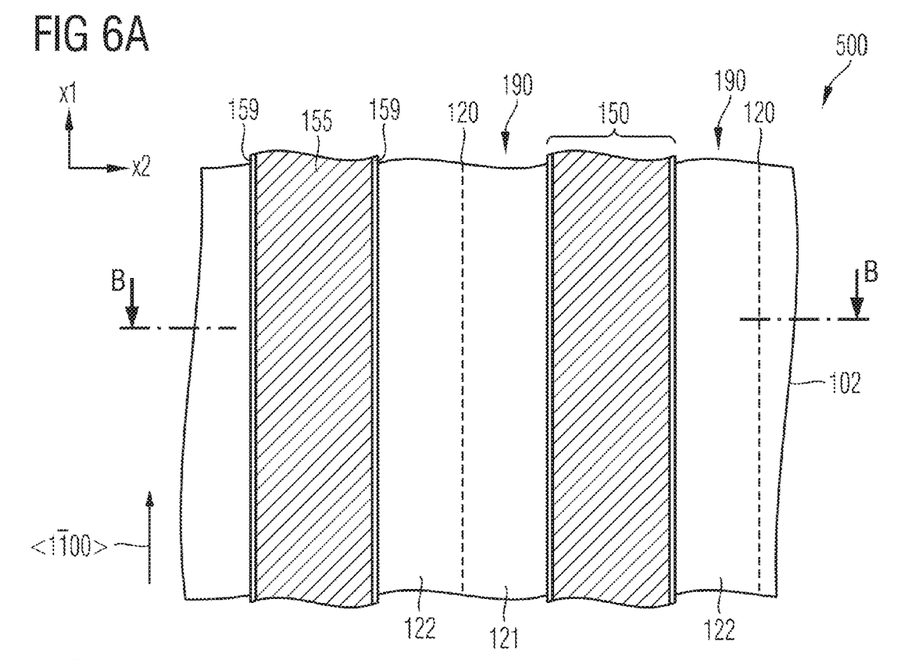
FIG. 6A is a schematic horizontal cross section through a section of a semiconductor device in accordance with one embodiment comprising strip-like transistor cells having deep trench gate electrodes and a transistor channel on one side.
Figure 6B:
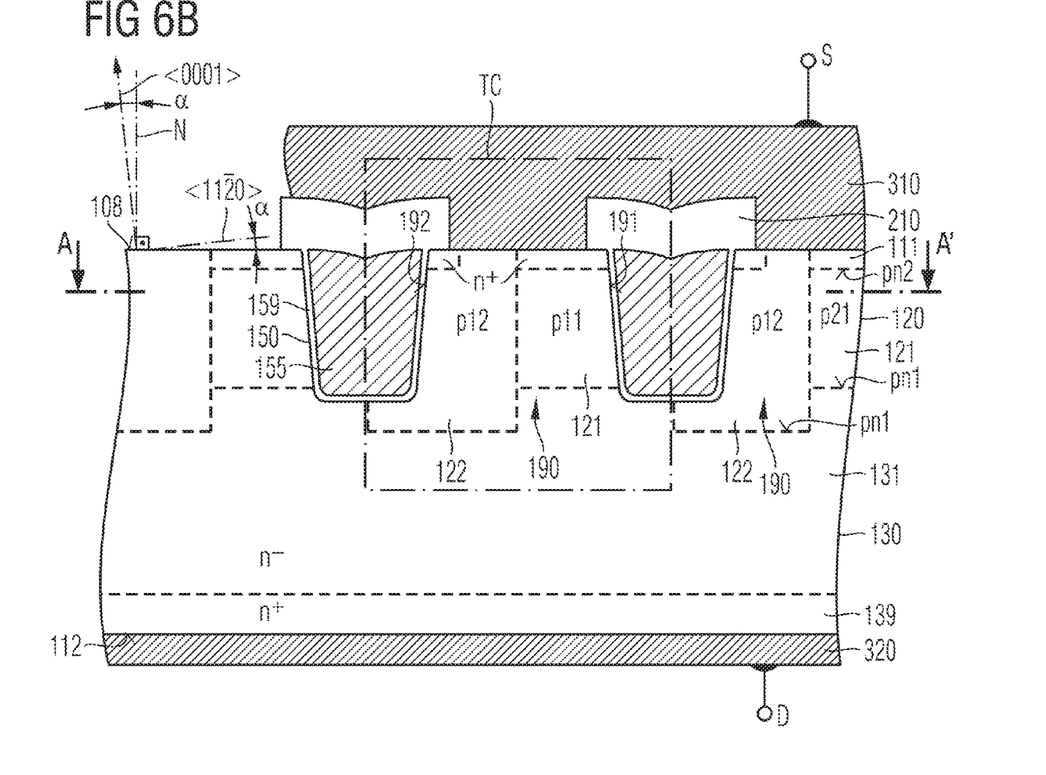
FIG. 6B is a schematic vertical cross section through the section of the semiconductor device according to FIG. 6A along the cross-sectional line B-B.

FIGS. 6A and 6B show a semiconductor device 500 comprising a SiC semiconductor body 100 comprising strip-like transistor cells TC and deep trench gate structures 150.

On a front side, the SiC semiconductor body 102 has the first surface 108, which can comprise coplanar surface sections which can form a ribbed first surface. The first surface 108 can coincide with a principal lattice plane or extend at an angular deviation α obliquely with respect to a lattice plane, e.g. with respect to the (0001) lattice plane, wherein the angular deviation can be at most 12°, e.g. approximately 4°.

In the embodiment illustrated, the <0001> crystal direction is inclined by an angular deviation α with respect to a normal N. The <11-20> crystal direction is inclined by the same angular deviation α with respect to the horizontal plane. The <1-100> crystal direction is orthogonal to the cross-sectional plane.

On the rear side, the SiC semiconductor body 102 has the second surface 112, which is parallel to the first surface 108.

A drift structure 130 formed in the SiC semiconductor body 102 comprises at least one highly doped contact layer 139 adjoining the second surface 112, and also a weakly doped drift zone 131 of the second conductivity type between the first surface 108 and the highly doped contact layer 139. Optionally, a buffer layer can also be incorporated between the drift zone 131 and the highly doped contact layer 139, which buffer layer has a doping concentration which on average is higher than the doping concentration within the drift zone 131 and lower than the doping concentration within the contact layer 130 and also has the same conductivity type as these two zones.

The highly doped contact layer 139 is of the same conductivity type as the drift zone 131 and can be or comprise a substrate section sawn from a crystal or sliced from a crystal or may have arisen completely from an epitaxy method. The contact layer 139 forms an ohmic contact with a second load electrode 320, which can directly adjoin the second surface 112. Along the second surface 112 the dopant concentration of the contact layer 139 is high enough to form a low-resistance contact with the second load electrode 320.

The drift zone 131 can be formed in a layer grown by epitaxy on the contact layer 139. An average dopant concentration in the drift zone 131 lies for example in a range of from at least $10^{15}$ cm$^{-3}$ to at most $5\times10^{16}$ cm$^{-3}$. Besides the drift zone 131 and the contact layer 139, the drift structure 130 can comprise further doped regions, for example field stop zones, blocking or barrier zones and/or current spreading zones of the conductivity type of the drift zone 131 and/or insular, columnar and/or strip-shaped regions of the complementary conductivity type.

Transistor cells TC on the front side of the SiC semiconductor body 102 are formed along gate structures 150 extending from the first surface 108 into the SiC semiconductor body 102, wherein mesa sections 190 of the SiC semiconductor body 100 separate adjacent gate structures 150 from one another.

A longitudinal extent of the gate structures 150 along a first horizontal direction x1 is greater than a width of the gate structures 150 along a second horizontal direction x2 orthogonal to the first horizontal direction and transverse to the longitudinal extent. The gate structures 150 can be longitudinal trenches extending from one side of a cell array region having the transistor cells TC as far as an opposite side. The length of the gate structures 150 can be up to a plurality of 100 μm, or up to a plurality of millimetres or even up to a plurality of centimetres.

In accordance with other exemplary embodiments, the gate structures 150 can be formed along parallel lines extending in each case from one side of the cell array region to the opposite side, and wherein a multiplicity of gate structures 150 separated from one another are formed in each case along the same line. The gate structures 150 can also form a lattice with the mesa sections 190 in the meshes of the lattice.

The gate structures 150 can be spaced apart uniformly from one another, can have the same width and/or can form a regular pattern. A centre-to-centre distance between the gate structures 150 can lie in a range of from at least 1 μm to at most 10 μm, e.g. from at least 2 μm to at most 5 μm. A vertical extent of the gate structures 150 can be at least 300 nm to at most 5 μm, e.g. can lie in a range of from at least 500 nm to at most 2 μm.

Sidewalls of the gate structures 150 can be oriented vertically with respect to the first surface 108 or can be tilted slightly relative to the vertical direction, wherein mutually opposite sidewalls can extend parallel or obliquely with respect to one another. In accordance with one embodiment, the width of the gate structures 150 decreases with increasing distance from the first surface 108. By way of example, one sidewall deviates by the angular deviation α and the other sidewall by −α from the normal N.

The mesa sections 190 comprise two opposite mesa sidewalls 191, 192, which directly adjoin two adjacent gate structures 150. At least one first mesa sidewall 191 lies in a lattice plane with high charge carrier mobility, e.g. in the case of 4H—SiC in an (11-20) lattice plane, the so-called A-plane. The second mesa sidewall 192 opposite the first mesa sidewall 191 can be inclined by double the angular deviation α, for example by approximately 8°, with respect to the relevant lattice plane.

The gate structures 150 comprise a conductive gate electrode 155, which can comprise a highly doped polycrystalline silicon layer, an integral or multipartite metal structure or both. The silicon layer can be electrically connected to a gate metallization, which forms a gate terminal or is electrically connected or coupled to such a terminal.

Along at least one side of the gate structure 150, a gate dielectric 159 separates the gate electrode 155 from the SiC semiconductor body 102. The gate dielectric 159 can comprise a semiconductor dielectric, for example a thermally grown or deposited semiconductor oxide, e.g. silicon oxide, a semiconductor nitride, for example a deposited or thermally grown silicon nitride, a semiconductor oxynitride, for example a silicon oxynitride, some other deposited dielectric material or an arbitrary combination of the materials mentioned. The layer thickness of the gate dielectric 159 can be chosen for example such that a threshold voltage of the transistor cells TC lies in a range of from 1V to 8V.

The gate structures 150 can exclusively comprise the gate electrode 155 and the gate dielectric 159 or can comprise further conductive and dielectric structures, e.g. field plates and isolation dielectrics, in addition to the gate electrode 155 and the gate dielectric 159.

In the mesa sections 190, source regions 111 are formed towards the front side of the SiC semiconductor body 102, which source regions can directly adjoin the first surface 108 and the first mesa sidewall 191 of the respective mesa section 190. In this case, each mesa section 190 can comprise a source region 111 having sections connected to one another in the SiC semiconductor body 102 or having at least two sections separated from one another in the SiC semiconductor body 102, said sections being electrically connected to one another with low resistance via a contact or trench contact adjoining the mesa section 190.

The mesa sections 190 furthermore comprise doped regions 120, which separate the source regions 111 from the drift structure 130 and form first pn junctions pn1 with the drift structure 130 and second pn junctions pn2 with the source regions 111. The doped regions 120 form an ohmic contact with the first load electrode 310.

In the exemplary embodiment depicted, a doped region 120 comprises a more weakly doped body region 121 and a more heavily doped shielding region 122.

The body region 121 directly adjoins the first mesa sidewall 191. In the on state of the transistor cell TC, an inversion channel connecting the source region 110 to the drift structure 130 is formed in the body region 121 along the gate structure 150. A vertical extent of the body region 121 corresponds to a channel length of the transistor cells TC and can be for example 200 nm to 1500 nm.

The shielding regions 122, which ensure protection of a bottom of the gate structure 150 (so-called trench bottom) for the case of high field strengths in the off state, are formed between the body regions 121 and the second mesa sidewalls 192 and can directly adjoin the body regions 121. A vertical extension of the shielding regions 122 can be greater than a vertical extent of the body regions 121, for example greater than a vertical extent of the gate structures 150. A part of a shielding region 122 can be formed directly between the bottom of the gate structure 150 and the second surface 112 and shield the gate structure 150 from the potential of the second load electrode 320. A maximum dopant concentration p12 in the shielding regions 122 along the second mesa sidewalls 192 is higher, e.g. at least two times or even five times higher, than a maximum dopant concentration p11 in the body regions 121 along the first mesa sidewalls 191.

The first load electrode 310 can form a source terminal S or be electrically connected or coupled to the source terminal S. The second load electrode 320 on the rear side can form a drain terminal D or be electrically connected or coupled to the drain terminal D.

In accordance with one exemplary embodiment, the transistor cells TC are n-channel FET cells comprising p-doped body regions 121, n-doped source regions 110 and an n-doped drift zone 131. In accordance with another embodiment, the transistor cells TC are p-channel FET cells comprising n-doped body regions 121, p-doped source regions 110 and a p-doped drift zone 131.

A load current flowing through the SiC semiconductor body 102 between the first and second load electrodes 310, 320 in the on state of the semiconductor device 500 passes through the body regions 121 in inversion channels induced along the gate dielectric 159. The higher dopant concentration in the shielding regions 122 in comparison with the dopant concentration in the body regions 121 during operation, within the absolute limit data, suppresses the formation of inversion channels along the second mesa sidewalls 192 and affords in particular protection of the bottom of the gate structure 150 for the case of high field strengths in the off state. Since this region serves in particular to protect the bottom of the gate structure 150 in the off state, the doping of this region with dopants having deep energy levels is particularly advantageous. Since this region should bring about only a relatively small injection of free charge carriers, this is ensured in an outstanding manner in the on state by virtue of the only relatively small activation of these dopants, but without having to accept losses in the protective effect for the bottom of the gate structure 150, since these atoms having deep energy levels are in turn activated approximately completely as soon as they lie within a space charge zone.

Figure 7:
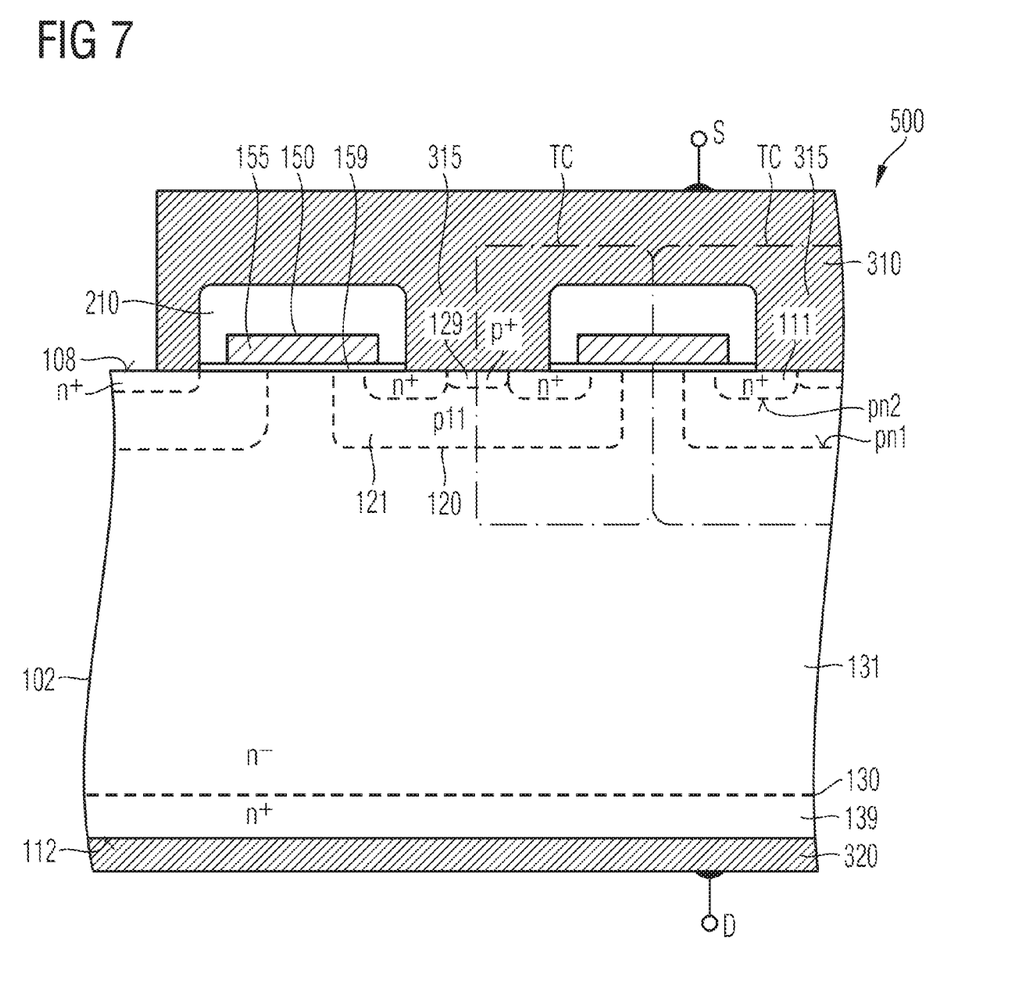
FIG. 7 is a schematic vertical cross section through a section of a semiconductor device in accordance with one embodiment comprising planar gate structures.

FIG. 7 shows a semiconductor device 500 comprising planar gate structures 150 on the front side of the SiC semiconductor body 102, wherein within a cell array region an individual gate structure 150 is assigned to two transistor cells TC formed symmetrically with respect to the gate structure 150.

The gate structures 150 comprise a conductive gate electrode 155 and a gate dielectric 159, which is formed directly on the first surface 101 and separates the gate electrode 155 from the SiC semiconductor body 102. A doped region 120 extending from the first surface 108 into the SiC semiconductor body 102 is assigned in each case to two adjacent transistor cells TC of two adjacent gate structures 150. Source regions 110 of the two transistor cells TC extend from the first surface 108 into the doped region 120. The doped region 120 comprises a contact region 129, in which the dopant concentration is higher than the dopant concentration in a main region of the doped region 120 outside the contact region 129, which can adjoin the first surface 101 between the source regions 111. The main region of the doped region 120 forms the body region 121 of the transistor cell TC.

A drift structure 130 having a drift zone 131 and a contact layer 139 separates the transistor cells TC from a second surface 112 of the SiC semiconductor body 102, wherein the drift zone 131 can extend between adjacent body regions 121 and below the gate electrodes 155 to the first surface 108.

In the on state, the transistor cells TC form lateral inversion channels in channel regions of the body regions 121 along the gate dielectric 159, which inversion channels connect the source regions 110 to the sections of the drift structure 130 that adjoin the first surface 108, e.g. to the drift zone 131.

An interlayer dielectric 210 isolates the gate electrode 155 from a first load electrode 310 on the front side of the SiC semiconductor body 102. Contacts 315 in openings of the interlayer dielectric 210 connect the first load electrode 310 to the contact regions 129 and the source regions 111.

Figure 8:
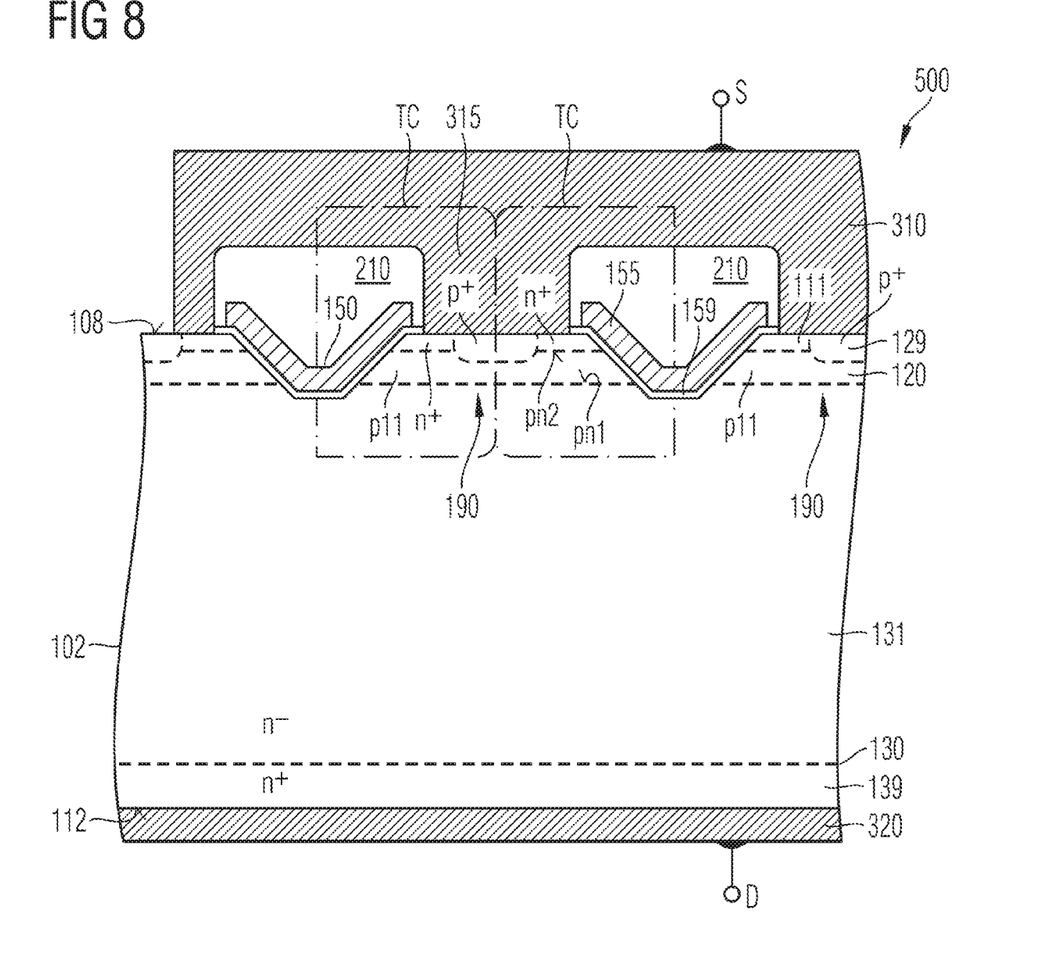
FIG. 8 is a schematic vertical cross section through a section of a semiconductor device in accordance with one embodiment comprising shallow trench gate structures.

In FIG. 8, the gate structures 150 are formed in shallow trenches having an approximately V-shaped vertical cross-sectional area. The gate electrode 155 can extend with approximately uniform layer thickness along the sidewalls and the bottom of the trenches. Mesa sections 190 of the SiC semiconductor body 102 between adjacent gate structures 150 comprise source regions 111 formed along the first surface 108 and also doped regions 120 between the source regions 110 and the drift structure 130, wherein the doped regions 120 can each comprise a more weakly doped body region 121 and a more heavily doped contact region 129.

Figure 9:
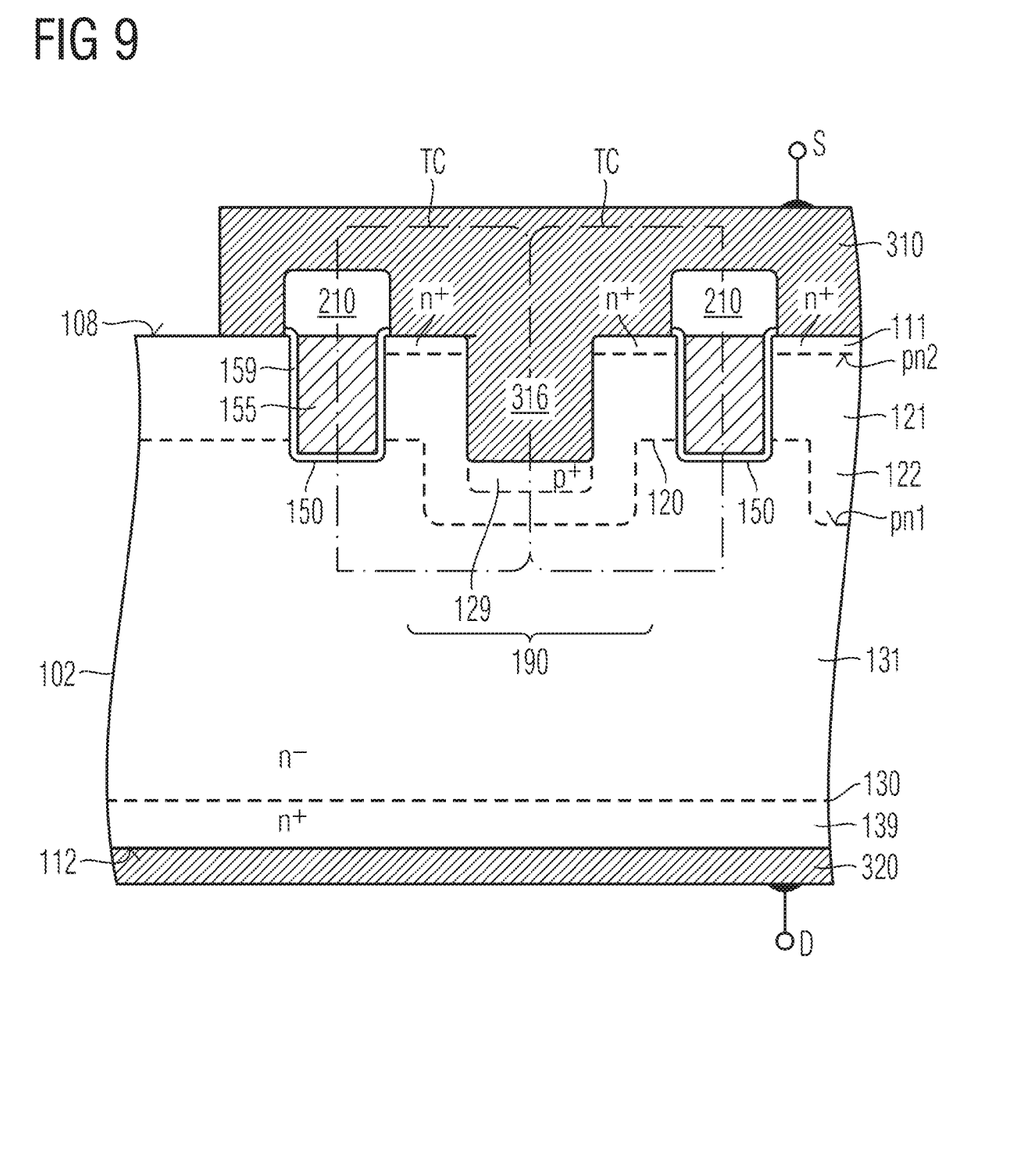
FIG. 9 is a schematic vertical cross section through a section of a semiconductor device in accordance with one further embodiment comprising deep trench gate structures.

The semiconductor device 500 in FIG. 9 comprises gate structures 150 extending from the first surface 108 into a SiC semiconductor body 102, wherein the sidewalls of the gate structures 150 extend vertically with respect to the first surface 108. Doped regions 120 are formed in mesa sections 190 of the SiC semiconductor body 102 between adjacent gate structures 150, said doped regions forming first pn junctions pn1 with a drift structure 130 and second pn junctions pn2 with source regions 111 formed along the first surface 108.

An interlayer dielectric 210 isolates a gate electrode 155 of the gate structures 150 from a first load electrode 310. Between adjacent gate structures 150, trench contacts 316 extend from the first load electrode 310 into the mesa sections 190, laterally contact the SiC semiconductor body 102 and connect the source regions 111 to the first load electrode 310. A vertical extent of a section of the trench contact 316 in the SiC semiconductor body 102 can approximately correspond to the vertical extent of the gate structures 150.

A part of the doped region 120 can in each case be formed below the trench contacts 316 and separate the latter from the drift structure 130. A more heavily doped contact region 129 of the doped region 120 can be directly adjacent to the trench contact 316.

The exemplary embodiments shown in FIGS. 6A to 9 are exemplary FETs of the semiconductor devices 100 shown in FIGS. 1 to 5D, wherein the body regions 121 in FIGS. 6B, 7, 8, 9 can correspond to the first semiconductor region 104 described in association with FIG. 1. Likewise, the shielding region 122 in FIG. 6B can correspond to the first semiconductor region 104 described in association with FIG. 1. Moreover, both the body region 121 and the shielding region 122 can be constructed like the first semiconductor region 104 described in association with FIG. 1. The drift zone 131 in FIGS. 6B, 7, 8, 9 can correspond for example to the second semiconductor region 106 described in association with FIG. 1.

Although specific embodiments have been illustrated and described herein, those skilled in the art will recognize that the specific embodiments shown and described can be replaced by a multiplicity of alternative and/or equivalent configurations, without departing from the scope of protection of the invention. The application is intended to cover any adaptations or variations of the specific embodiments discussed herein. Therefore, the invention is restricted only by the claims and the equivalents thereof.

What is claimed is:

1. A semiconductor device, comprising:
a SiC semiconductor body comprising a first semiconductor region of a first conductivity type and a second semiconductor region of a second conductivity type,
wherein the first semiconductor region is electrically contacted at a first surface of the SiC semiconductor body and forms a pn junction with the second semiconductor region,
wherein the first semiconductor region and the second semiconductor region are arranged one above the other in a vertical direction perpendicular to the first surface,
wherein the first semiconductor region has a first dopant species and a second dopant species,
wherein an energy gap between the first dopant species and the closest band edge is less than 250 meV,
wherein an energy gap between the second dopant species and the closest band edge is more than 250 meV, and
wherein the first semiconductor region has a vertical extension d along the vertical direction of the SiC semiconductor body, and wherein in the first semiconductor region, proceeding from the first surface, in a first depth range of from 0 to d/2 at least 60% of the dopants of the first conductivity type correspond to the first dopant species, and in a second depth range of from d/2 to d at least 30% of the dopants of the first conductivity type correspond to the second dopant species.

2. The semiconductor device of claim 1, wherein the first dopant species is Al and the second dopant species is B or Ga.

3. The semiconductor device of claim 1, wherein the first semiconductor region additionally has a third dopant species of the first conductivity type, wherein the second dopant species is B or Ga, and wherein the third dopant species corresponds to that species from B and Ga which is different from the second dopant species.

4. The semiconductor device of claim 1, wherein a maximum dopant concentration of the first dopant species in the first depth range is greater than a maximum dopant concentration of the second dopant species in the second depth range.

5. The semiconductor device of claim 1, wherein a maximum dopant concentration of the first dopant species in the first depth range is less than a maximum dopant concentration of the second dopant species in the second depth range.

6. The semiconductor device of claim 1, wherein an average dopant concentration of the first dopant species in a first part of the first semiconductor region adjoining the first surface of the SiC semiconductor body is greater than an average dopant concentration of the second dopant species, and wherein the average dopant concentration of the second dopant species in a second part of the first semiconductor region adjoining the second semiconductor region is greater than the dopant concentration of the first dopant species.

7. The semiconductor device of claim 6, wherein the first part proceeding from the first surface undergoes transition to the second part at a depth, and wherein the depth lies in a range of between 50% and 80% of a vertical penetration depth of the first semiconductor region into the SiC semiconductor body.

8. The semiconductor device of claim 1, wherein the second semiconductor region is a drift zone.

9. The semiconductor device of claim 1, wherein the first semiconductor region is p-doped and the second semiconductor region is n doped.

10. The semiconductor device of claim 9, wherein a partial compensation of the n-type doping with boron is present in a part of the n-doped drift zone adjoining the p-doped first semiconductor region.

11. The semiconductor device of claim 1, further comprising:
a first load terminal at the first surface of the SiC semiconductor body; and a second load terminal at a second surface of the SiC semiconductor body opposite the first surface wherein the semiconductor device is configured to conduct a load current of at least 1 A.

12. The semiconductor device of claim 1, wherein the semiconductor device is an insulated gate field effect transistor and the first semiconductor region is a body region adjoining a gate dielectric.

13. The semiconductor device of claim 1, wherein the semiconductor device is an insulated gate field effect transistor and the first semiconductor region extends into the SiC semiconductor body more deeply than a body region adjoining a gate dielectric.

14. The semiconductor device of claim 13, wherein the gate dielectric is formed in a gate trench, wherein the body region adjoins a first sidewall of the gate trench, wherein the first sidewall is situated opposite a second sidewall of the gate trench, and wherein the first region adjoins the second sidewall of the gate trench.

15. The semiconductor device of claim 1, wherein the semiconductor device is a power semiconductor diode and the first region is an anode region.

16. A semiconductor device, comprising:

a SiC semiconductor body comprising a first semiconductor region of a first conductivity type and a second semiconductor region of a second conductivity type, wherein the first semiconductor region is electrically contacted at a first surface of the SiC semiconductor body and forms a pn junction with the second semiconductor region, wherein the first semiconductor region and the second semiconductor region are arranged one above the other in a vertical direction perpendicular to the first surface, wherein the first semiconductor region has a first dopant species and a second dopant species, wherein an energy gap between the first dopant species and the closest band edge is less than 250 meV, wherein an energy gap between the second dopant species and the closest band edge is more than 250 meV, wherein in a first partial region and a second partial region of the first semiconductor region, the second partial region being at a distance from the first partial region in the vertical direction, a concentration of the first dopant species exceeds a concentration of the second dopant species, and wherein in a third partial region of the first semiconductor region which lies between the first partial region and the second partial region, a concentration of the second dopant species exceeds a concentration of the first dopant species.

17. The semiconductor device of claim 16, wherein a maximum concentration of the first dopant species in the first partial region and the second partial region is greater than a maximum concentration of the second dopant species in the third partial region.

* * * * *